United States Patent
Deguenther (10) Patent No.: US 8,351,023 B2
(45) Date of Patent: Jan. 8, 2013

(54) ILLUMINATION DEVICE OF A MICROLITHOGRAPHIC PROJECTION EXPOSURE APPARATUS, AND MICROLITHOGRAPHIC PROJECTION EXPOSURE METHOD

(75) Inventor: Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 260 days.

(21) Appl. No.: 12/850,131

(22) Filed: Aug. 4, 2010

(65) Prior Publication Data

US 2010/0315616 A1 Dec. 16, 2010

Related U.S. Application Data

(63) Continuation of application No. 12/637,889, filed on Dec. 15, 2009, now abandoned.

(30) Foreign Application Priority Data

Dec. 17, 2008 (DE) .......................... 10 2008 054 844

(51) Int. Cl.
G03B 27/72 (2006.01)
G03B 27/54 (2006.01)
G03B 27/68 (2006.01)
G03B 27/42 (2006.01)
G03B 27/52 (2006.01)
G03B 27/32 (2006.01)

(52) U.S. Cl. ................ 355/71; 355/52; 355/53; 355/55; 355/67; 355/77

(58) Field of Classification Search .................... 355/52, 355/53, 55, 66, 67–71, 77; 250/492.1, 492.2, 250/492.22, 548; 359/196.1
See application file for complete search history.

(56) References Cited

U.S. PATENT DOCUMENTS

| | | | |
|---|---|---|---|
| 4,937,619 A * | 6/1990 | Fukuda et al. | 355/53 |
| 6,504,644 B1 * | 1/2003 | Sandstrom | 359/291 |
| 6,577,379 B1 | 6/2003 | Boettiger et al. | |
| 6,707,534 B2 * | 3/2004 | Bjorklund et al. | 355/53 |
| 6,833,904 B1 | 12/2004 | Komatsuda | |
| 2004/0141166 A1 * | 7/2004 | Bleeker et al. | 355/53 |
| 2004/0234871 A1 * | 11/2004 | Boettiger et al. | 430/5 |
| 2005/0179881 A1 | 8/2005 | Kohno | |
| 2006/0061749 A1 * | 3/2006 | Bleeker et al. | 355/67 |
| 2006/0087634 A1 | 4/2006 | Brown et al. | |
| 2007/0165202 A1 * | 7/2007 | Koehler et al. | 355/67 |
| 2007/0195305 A1 * | 8/2007 | Mulder et al. | 355/71 |
| 2007/0273853 A1 | 11/2007 | Bleeker et al. | |
| 2008/0013065 A1 | 1/2008 | Kohl et al. | |

FOREIGN PATENT DOCUMENTS

| | | |
|---|---|---|
| DE | 103 43 333 | 4/2005 |
| DE | 10 2006 032 810 | 1/2008 |
| WO | WO 2005/026843 | 3/2005 |
| WO | WO 2005/069081 | 7/2005 |
| WO | WO 2006/040184 | 4/2006 |

* cited by examiner

*Primary Examiner* — Toan Ton
*Assistant Examiner* — Christina Riddle
(74) *Attorney, Agent, or Firm* — Fish & Richardson P.C.

(57) ABSTRACT

Illumination devices of a microlithographic projection exposure apparatus, include a deflection device with which at least two light beams impinging on the deflection device can be variably deflected independently of one another by variation of the deflection angle in each case in such a way that each of the light beams can be directed onto at least one location in a pupil plane of the illumination device via at least two different beam paths; wherein, on the beam paths, at least one optical property of the respective light beam is influenced differently.

21 Claims, 6 Drawing Sheets

ILLUMINATION DEVICE OF A MICROLITHOGRAPHIC PROJECTION EXPOSURE APPARATUS, AND MICROLITHOGRAPHIC PROJECTION EXPOSURE METHOD

CROSS-REFERENCE TO RELATED APPLICATIONS

This application is a continuation of U.S. application Ser. No. 12/637,889, filed Dec. 15, 2009, which claims priority under 35 U.S.C. §119 to German Patent Application DE 10 2008 054 844.8, filed Dec. 17, 2008. The contents of both of these applications are hereby incorporated by reference in its entirety.

BACKGROUND

The disclosure relates to an illumination device of a microlithographic projection exposure apparatus, and to a microlithographic projection exposure method. In particular, the disclosure relates to an illumination device and to a microlithographic projection exposure method which, in conjunction with comparatively little structural outlay, enable a light property such as, e.g., the polarization or the intensity to be flexibly and rapidly changed or adapted.

Microlithography is employed for producing microstructured components such as integrated circuits or LCDs, for example. The microlithography process is typically carried out in a so-called projection exposure apparatus, having an illumination device and a projection objective. In this case, the image of a mask (=reticle) illuminated by means of the illumination device is projected, by means of the projection objective, onto a substrate (e.g., a silicon wafer) coated with a light-sensitive layer (e.g., photoresist) and arranged in the image plane of the projection objective, in order to transfer the mask structure to the light-sensitive coating of the substrate. During operation of a microlithographic projection exposure apparatus there is a need to set defined illumination settings, that is to say intensity distributions in a pupil plane of the illumination device, in a targeted manner. In addition to the use of diffractive optical elements (so-called DOEs), the use of mirror arrangements is also known for this purpose, e.g., from WO 2005/026843 A2. Such mirror arrangements include a multiplicity of micromirrors that can be set independently of one another.

Various further approaches are known for setting specific polarization distributions in a targeted manner, for the purpose of optimizing the imaging contrast, in particular in the pupil plane of the illumination device or in the reticle plane.

There can be a need to be able to set further different distributions of the polarization and/or intensity in the illumination device (that is to say different illumination settings). One application example thereof is, for instance, the compensation of polarization-dependent reflection properties of the HR layers present on the mirrors or AR layers present on the lenses, which, without compensation measures, have the effect that, e.g., elliptically polarized light is generated from originally linearly polarized light.

Furthermore, there is increasingly also a need to produce further illumination settings, which are sometimes also referred to as "freeform illumination settings" and which can have, e.g., a plurality of illumination poles in such a way that in some of said illumination poles the polarization direction is oriented perpendicularly (that is to say tangentially) and in others of said illumination poles the polarization direction is oriented parallel (that is to say radially) with respect to the radius directed at the optical system axis. Such illumination settings are used, e.g., in so-called "source mask optimization" in conjunction with comparatively exotic mask structures in order to obtain the desired structure by suitable combination of the mask design with the illumination setting during imaging at the wafer level.

SUMMARY

Illumination devices are disclosed that provide a microlithographic projection exposure apparatus and a microlithographic projection exposure method which, in conjunction with comparatively little structural outlay, enable a light property such as the polarization or the intensity, for example, to be flexibly and rapidly changed or adapted.

In a first aspect, the invention features an illumination device of a microlithographic projection exposure apparatus that has a deflection device, with which at least two light beams impinging on the deflection device can be variably deflected independently of one another by variation of the deflection angle in each case in such a way that each of said light beams can be directed onto at least one location in a pupil plane of the illumination device via at least two different beam paths, wherein, on said beam paths, at least one optical property of the respective light beam is influenced differently.

Embodiments feature utilizing a deflection device present in an illumination device, which deflection device (for instance in the form of a mirror arrangement, referred to for short as MMA="micro mirror array") is present anyway in diverse designs for the variation of the illumination setting produced in the pupil plane, for offering the illumination light alternative beam paths within the illumination device in which in turn at least one further light property (e.g., the polarization state, the intensity and/or the wavelength of the light) is influenced in a different manner relative to the respective beam paths.

In this case—for instance in contrast to dividing the illumination device into mutually separate or parallel-connected modules—different beam paths are provided for at least two light beams of the illumination light (preferably for all the light beams) independently of one another, thereby creating inceased (e.g., maximum) flexibility with regard to the obtainable manipulation of the relevant light property (e.g., polarization) or the illumination setting ultimately obtained in the pupil plane.

Among other advantages, the manipulation of the relevant light property (e.g. polarization) can be obtained solely by utilizing the degrees of freedom provided by the deflection device; in other words, no additional switchable components (such as, e.g., a Pockels cell) are required. The flexible setting or variation of the illumination setting that is made possible can therefore be realized with comparatively little structural outlay.

For realizing the different influencing of the light property (e.g., polarization) for the mutually different beam paths, all that may be necessary is to adapt the deflection angles that can be produced by the deflection device to the arrangement of optical elements used in the relevant beam paths for the manipulation of the relevant light property, that the relewant optical property of the beam bundle can be influenced differently for the beam paths.

In some embodiments, each location in the pupil plane (PP) is illuminated by a respective light beam impinging on the deflection device, via at least two different beam paths.

Different illumination settings can be set in the pupil plane by sole variation of deflection angles produced by the deflection device.

In certain embodiments, a polarization-manipulating optical element (e.g., an optical retarder or an optical rotator) is arranged in at least one of said beam paths.

An optical property that is influenced differently on said beam paths can be the polarization state of the respective light beam.

In some embodiments, an optical property that is influenced differently on said beam paths is the intensity of the respective light beam.

An optical property that is influenced differently on said beam paths can be the wavelength of the respective light beam.

In certain embodiments, the deflection device is embodied as a mirror arrangement having a plurality of mirror elements which can be adjusted independently of one another in order to alter an angle distribution of the light reflected by the mirror arrangement. The mirror elements can be adjusted in an angular range comprising at least the range of −2° to +2°, in particular at least the range of −5° to +5°, more particularly at least the range of −10° to +10°.

However, embodiments are not restricted to the configuration of the deflection device in the form of a mirror device or an MMA. In certain embodiments, instead of an MMA, by way of example, it is also possible to provide an exchangeable diffractive optical element (DOE) for producing alternative beam paths.

The illumination device furthermore can have a control device for driving the deflection device in a manner dependent on an operating state of the illumination device.

In another aspect, the invention features a mirror arrangement, in particular for use in an illumination device, including a plurality of mirror elements which can be adjusted independently of one another in order to alter an angle distribution of the light reflected by the mirror arrangement, wherein at least one of said mirror elements has a plurality of reflective surfaces which influence at least one optical property of the respectively reflected light in a different manner.

In some embodiments, at least two of said reflective surfaces are arranged at a finite angle with respect to one another. The optical property influenced in a different manner can be, in particular, the polarization state of the respectively reflected light.

In a further aspect, the invention features a microlithographic projection exposure method, wherein an object plane of a projection objective is illuminated by means of an illumination device, and wherein the object plane is imaged into an image plane of the projection objective using the projection objective, wherein light beams impinging on a deflection device provided in the illumination device are deflected by a deflection angle that can be set in variable fashion, and wherein different illumination settings are set in a pupil plane of the illumination device by sole variation of deflection angles produced by the deflection device.

In another aspect, the invention features a microlithographic projection exposure apparatus and a method for the microlithographic production of microstructured components.

Further configurations can be gathered from the description and also the claims.

Embodiments are described in greater detail below in conjunction with the accompanying figures.

DETAILED DESCRIPTION

Figure 1:
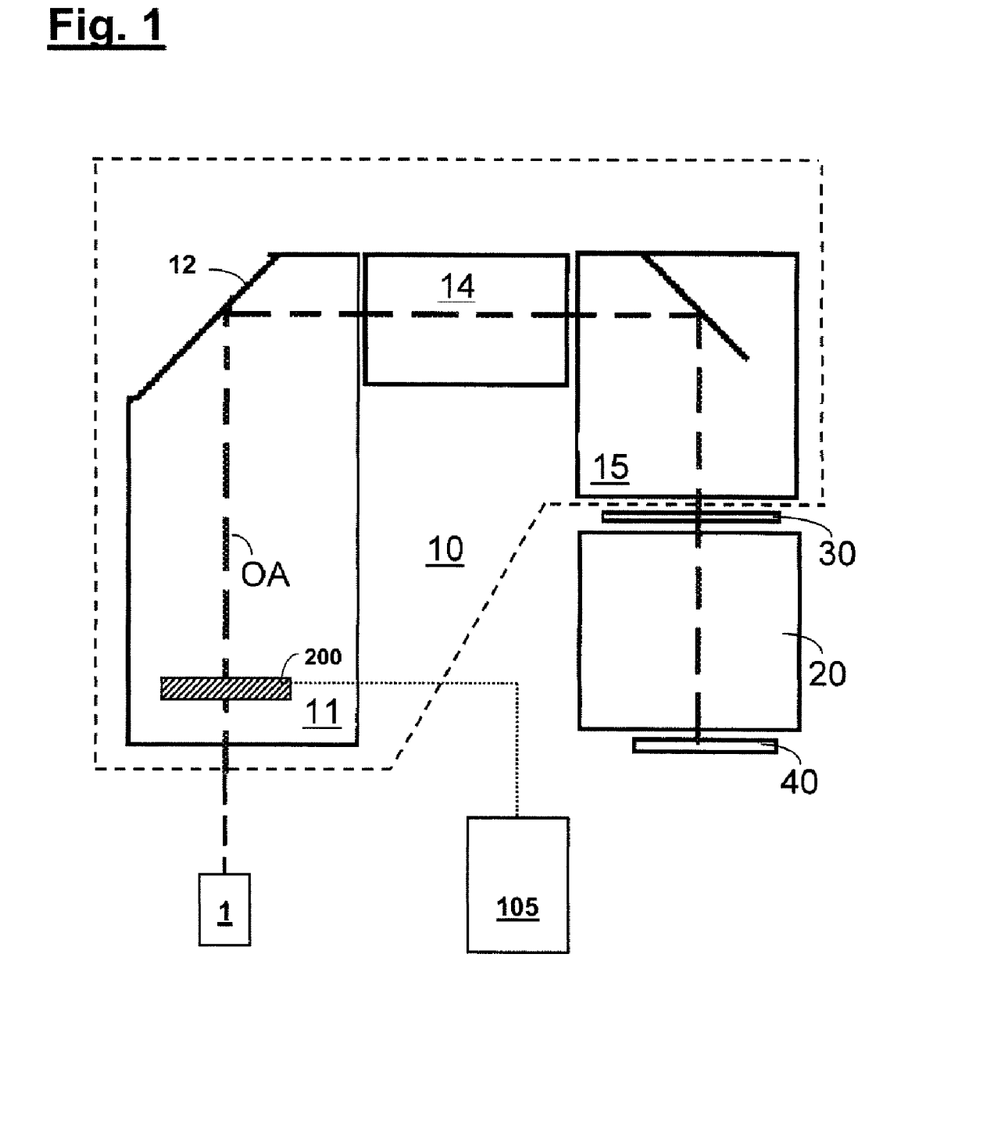
FIG. 1 shows a schematic illustration of an embodiment of a microlithographic projection exposure apparatus.

A basic construction of a microlithographic projection exposure apparatus with an optical system is firstly explained below with reference to FIG. 1. The projection exposure apparatus has an illumination device 10 and also a projection objective 20. The illumination device 10 serves for illuminating a structure-bearing mask (reticle) 30 with light from a light source unit 1, which includes, for example, an ArF excimer laser for an operating wavelength of 193 nm and also a beam shaping optical unit that produces a parallel light beam. In general, the illumination device 10 and also the projection objective 20 are preferably designed for an operating wavelength of less than 250 nm, more particularly less than 200 nm. The light source unit 1 can therefore alternatively, e.g., also have an $F_2$ laser for an operating wavelength of 157 nm.

The illumination device 10 has an optical unit 11, including, in particular, a deflection device in the form of a mirror arrangement (MMA) 200 for the variation of the illumination setting produced in a pupil plane of the illumination device, and also, in the example illustrated, a deflection mirror 12. Situated in the beam path in the light propagation direction downstream of the optical unit 11 are a light mixing device (not illustrated), which can have, for example, an arrangement of micro-optical elements that is suitable for achieving a light mixing, and also a lens group 14, behind which is situated a field plane with a reticle masking system (REMA), which is imaged by a REMA objective 15 disposed downstream in the light propagation direction onto the structure-bearing mask (reticle) 30, which is arranged in a further field plane, and thereby delimits the illuminated region on the reticle. The structure-bearing mask 30 is imaged by means of the projection objective 20 onto a substrate 40, or a wafer, provided with a light-sensitive layer. The projection objective 20 can be designed for immersion operation, in particular. Furthermore, it can have a numerical aperture NA of greater than 0.85, in particular greater than 1.1.

Figure 2:
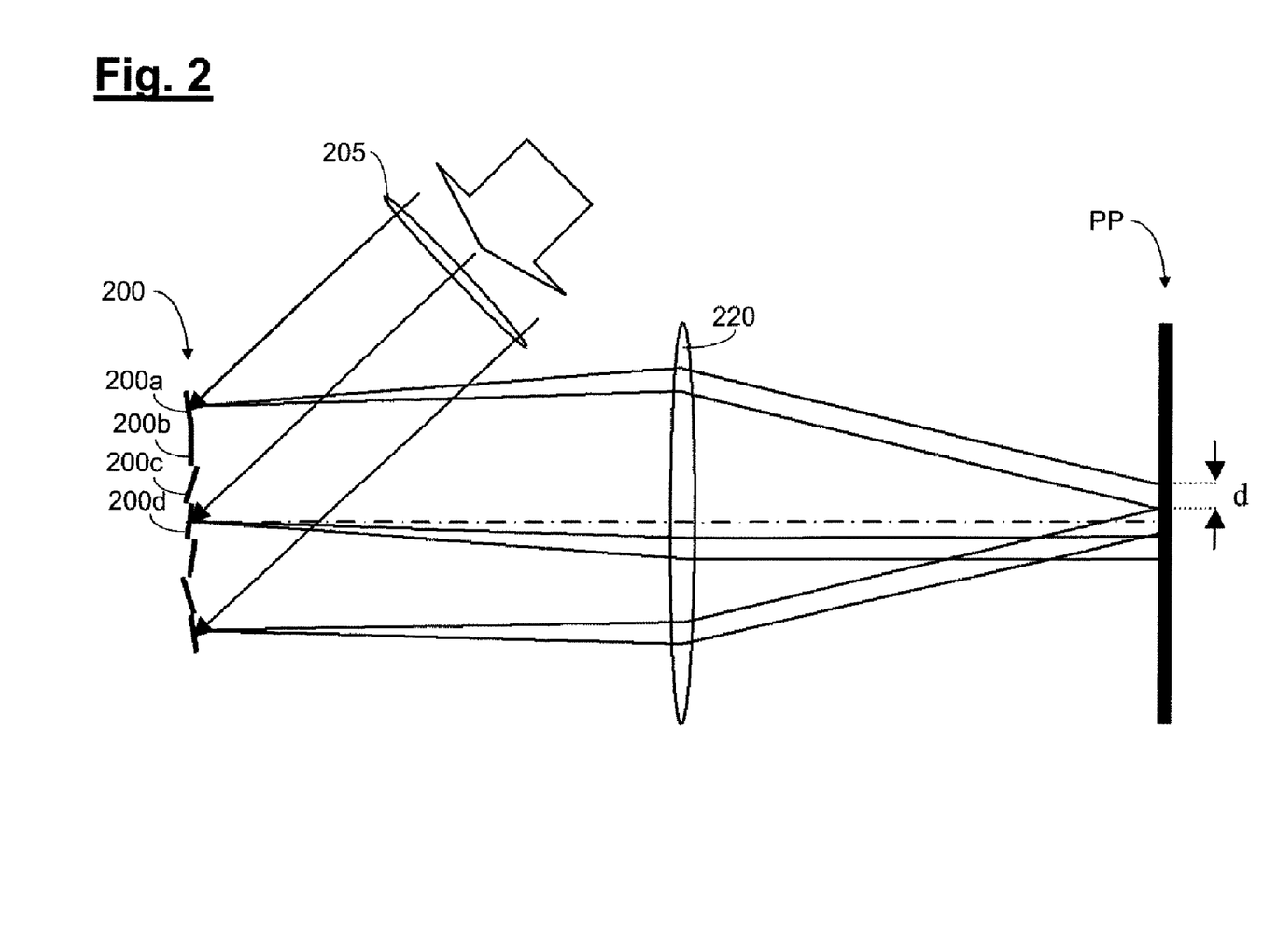
FIG. 2 shows a schematic illustration of an embodiment of a mirror arrangement in the illumination device from FIG. 1, and the manner of its operation.

In the construction illustrated schematically in FIG. 2, the mirror arrangement 200 has a plurality of mirror elements 200a, 200b, 200c, . . . . The mirror elements 200a, 200b, 200c, . . . are adjustable independently of one another for altering an angle distribution of the light reflected by the mirror arrangement 200, wherein, in accordance with FIG. 1, provision may be made of a driving unit 105 for driving this adjustment (e.g., by means of suitable actuators).

In accordance with FIG. 2, each of the mirror elements 200a, 200b, 200c, . . . generates a light spot having a diameter d in the pupil plane PP, wherein the positions thereof can be varied by corresponding tilting of the mirror elements.

The flexibility provided by the mirror arrangement 200 with regard to the beam paths that can be set for the light beams passing through the illumination device is utilized then for changing over between different illumination settings, wherein said illumination settings can differ from one another in particular by virtue of the in the polarization states obtained at specific pupil locations or illumination poles.

Embodiments can be distinguished by the fact that for this variation of the illumination settings, no additional switchable components (such as, e.g., a Pockels cell) are utilized for changing over between different polarization states; rather the degrees of freedom already present in the system on account of a deflection device, such as a mirror arrangement for example, present for setting different illumination settings are utilized in order to manipulate at least one further light property solely by variation of the setting of the deflection device. For this purpose, as explained in greater detail below with reference to FIGS. 3 and 4, the illumination device is configured in such a way that a light beam impinging on the mirror arrangement 200, by variation of the deflection angle, that is to say adjustment of the mirror element(s), can be directed respectively onto the same location in the pupil plane (PP) via different beam paths.

In particular, the arrangement can be chosen such that each individual mirror element 200a, 200b, 200c, . . . of the mirror arrangement 200 can reach each location within the illuminable region of the pupil plane PP on a plurality of different and mutually separate beam paths, or paths. In some embodiments, an optical element is arranged in at least one of said paths, said optical element influencing at least one optical property of the light beam impinging on said optical element.

Even though said light property is the polarization state in the exemplary embodiments described below with reference to FIGS. 3 and 4, the disclosure is not restricted thereto. In accordance with further embodiments, it is also possible e.g. to influence the intensity of the respective light beam on the relevant beam path, in which case, for example, a neutral filter can be used in the respective beam path. Furthermore, in order to vary the intensity, the mirror elements 200a, 200b, 200c, . . . of the mirror arrangement 200 can also be illuminated to different extents (by way of example, the intensity of the light impinging on the mirror arrangement 200 can be higher in the center of the mirror arrangement 200 than at the edge thereof), or the mirror elements 200a, 200b, 200c, . . . can have different reflectivities. In some embodiments, it is also possible to influence the wavelength of the respective light beam on the relevant beam path.

Figure 3:
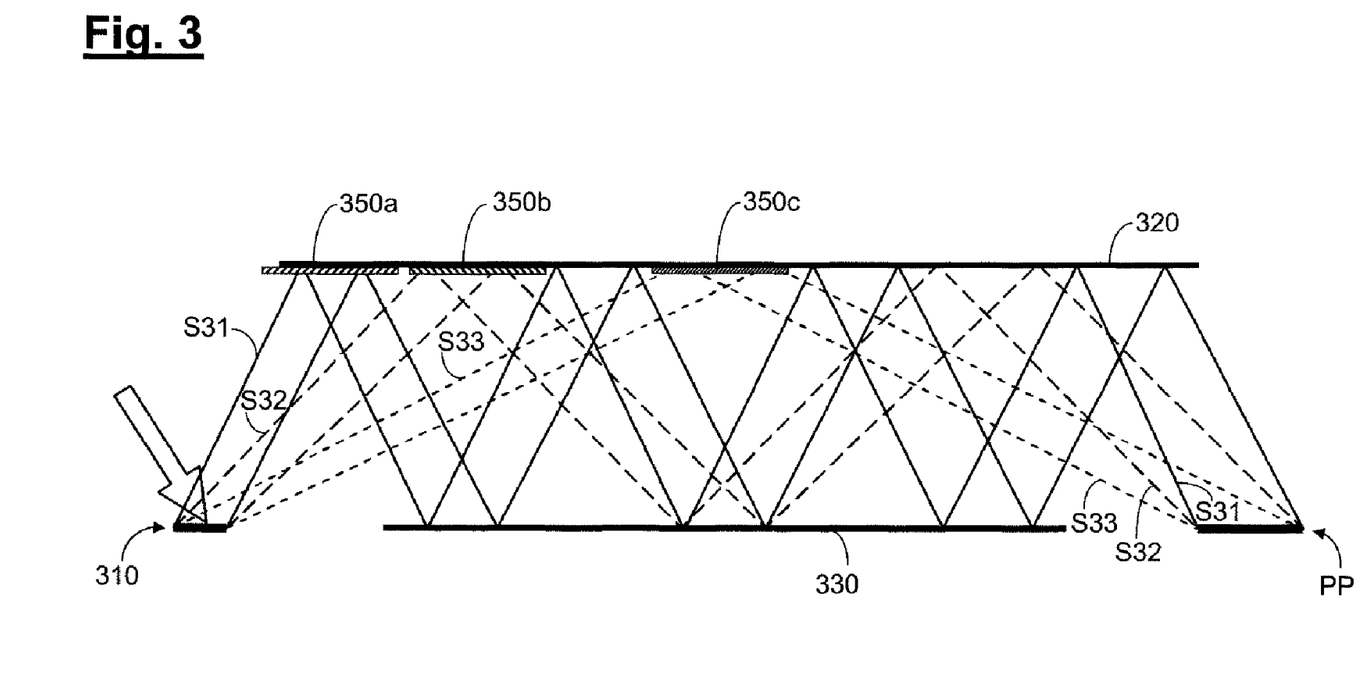
FIG. 3 shows a schematic illustration of an embodiment of a mirror arrangement.

FIG. 3 shows an arrangement that includes a first plane mirror 320 and a second plane mirror 330, arranged parallel thereto, this arrangement being situated downstream of a mirror arrangement 310 in the light propagation direction. In this case, FIG. 3 illustrates how a light beam proceeding from the same location or mirror element of the mirror arrangement 310 can respectively reach the same location within the pupil plane PP on three different beam paths, wherein these beam paths are designated by S31, S32 and S33 and illustrated by differently dashed (S32 and S33) and solid (S31) lines in FIG. 3. The beam path respectively chosen by the light beam can be selected by the variation of the tilting angle of the relevant mirror element of the mirror arrangement 310.

The embodiment in FIG. 3 is thus distinguished by the fact that the illumination of pupil plane PP is effected by utilizing multiple reflection at mutually opposite reflection surfaces. In order to realize this principle, the arrangement of plane mirrors as shown in FIG. 3 is not necessarily required; rather, provision may also be made of other reflective surfaces, for example also by utilizing total reflection.

350a, 350b and 350c designate optical elements or sections on the first plane mirror 320 which influence the polarization state of light beams respectively impinging on said sections in mutually different ways.

It becomes clear from FIG. 3 that, by using corresponding setting of the tilting angle, e.g., of the mirror element arranged furthest on the left in the light propagation direction on the mirror arrangement 310 in FIG. 3, a light beam can be directed as far as the extreme left-hand edge of the illuminated region of the pupil plane PP alternatively via the beam paths S31, S32 or S33, wherein the light beam passes through either the element 350a, the element 350b or the element 350c depending on the beam path. Depending on which element 350a, 350b or 350c the light beam passes through, a different polarization state is impressed on the relevant light beam, such that the setting of illumination settings which are different with regard to the polarization state is made possible without the use of further switchable components and by sole variation of the setting of the deflection device or of the deflection angles produced by the latter.

The optical elements or sections 350a, 350b and 350c can be embodied as retarders, for example, which, in transmission, set a retardation for light beams passing through and through which, depending on the position of the sections, the illumination light passes twice (in the case of arrangement directly on the mirror surface and suitable spacing of the sections) or alternatively just once (wherein in the latter case, e.g., the reflected beam no longer passes through the respective retarder). Retardation denotes the difference in the optical paths of two orthogonal (mutually perpendicular) polarization states.

The retarders can be produced in a known manner from optically uniaxial material such as, e.g., magnesium fluoride ($MgF_2$) having a suitable thickness. In some embodiments, the optical elements 350a, 350b and 350c can also be embodied as rotators which, by means of circular birefringence, bring about a rotation of the polarization direction and can be produced from optically active material, such as, e.g., crystalline quartz having a thickness suitable for the desired rotation angle and having a crystal axis running parallel to the optical system axis.

It goes without saying that the number of, in total, three polarization-optical sections present in the example in FIG. 3 is merely by way of example, and it is also possible to provide more or fewer of such different optical elements or sections (in particular including just a single optical element). Furthermore, these sections or optical elements can be arranged directly on the plane mirror 320, as shown in FIG. 3, or else at a distance therefrom (that is to say between the plane mirrors 320 and 330).

Figure 4:
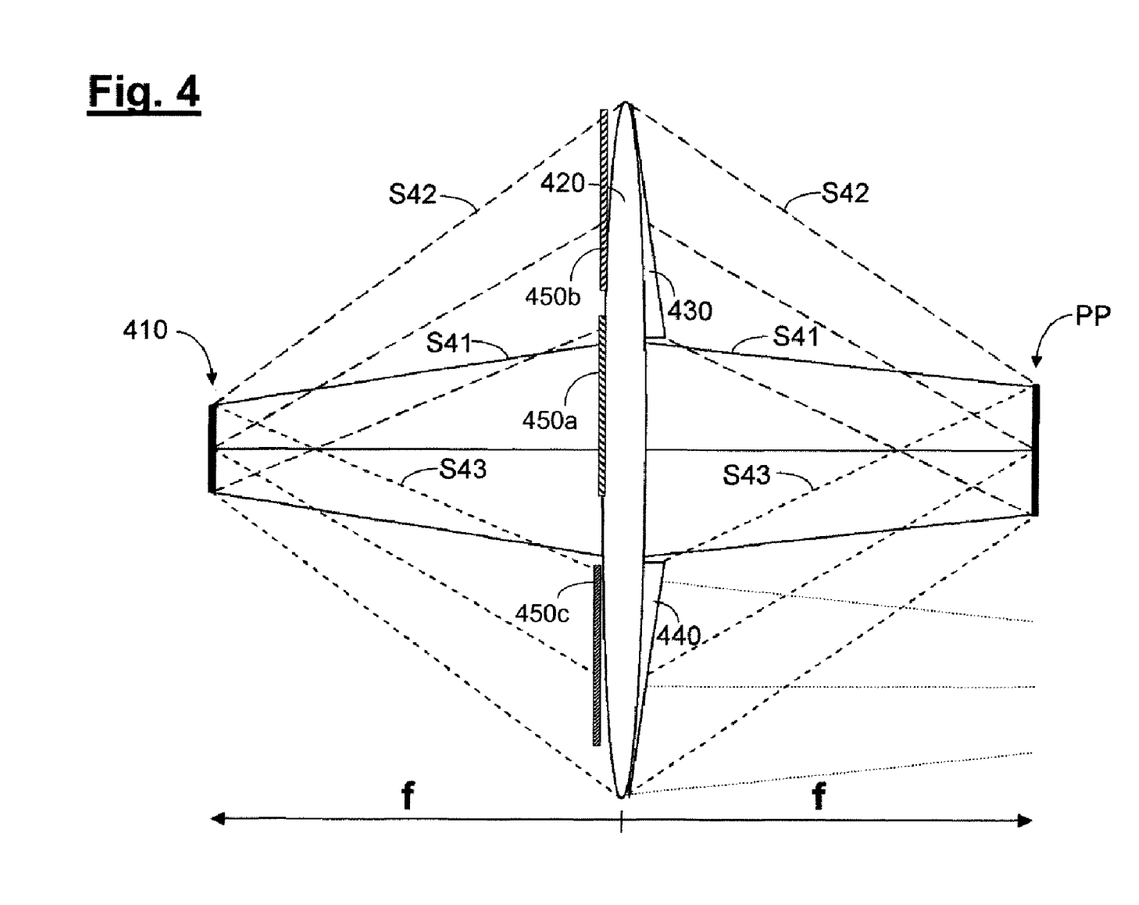
FIG. 4 shows a schematic illustration of components of an illumination device.

FIG. 4 shows a further embodiment, in which once again—analogously to FIG. 3—proceeding from the same mirror element of a mirror arrangement 410, one and the same location in the pupil plane PP can be illuminated via different beam paths. Once again (in particular polarization-) optical elements 450a, 450b and 450c are situated in these beam paths, which are designated by S41, S42 and S43 and illustrated in differently dashed fashion in FIG. 4, wherein only the element 450a is passed through on the beam path S41, only the element 450b is passed through on the beam path S42 and only the element 450c is passed through on the beam path S43.

Consequently, analogously to the embodiment shown in FIG. 3, it is possible to select for each assignment between a mirror element of the mirror arrangement 410 and a location in the pupil plane PP that path or beam path in which the polarization-optical element having the desired polarization-optical effect is situated in order, in this way, to impress a desired polarization state on the relevant light beam in variable fashion.

Situated between the mirror arrangement 410 and the pupil plane PP is a positive lens 420, the light proceeding from the mirror arrangement 410 being directed onto the pupil plane PP by virtue of the refractive power of said lens. In addition to the positive lens 420, further beam-deflecting elements, in the form of wedge-shaped prisms 430 and 440 in FIG. 4 are provided, which have the effect that light beams which run from the same location on the mirror arrangement 410 owing to variation of the tilting angle of the relevant mirror element at different angles or on different beam paths in the direction of the lens 420 (that is to say, e.g., on the beam paths S41, S42 and S43), impinge on the same location on the pupil plane PP. These beam-deflecting elements 430 and 440 are necessary in the example in FIG. 4 since the light beams proceeding from the mirror arrangement 410 at mutually different angles would not impinge on the same location in the pupil plane PP solely by means of the positive lens 420, and so the beam-deflecting elements 430 and 440 with wedge angles chosen in a suitable manner for providing the required deflection angles are necessary for the desired effect explained above.

The beam-deflecting elements 430 and 440, in the same way as the positive lens 420, can be produced from suitable lens material, for example quartz glass ($SiO_2$). With regard to the possible configurations of the (polarization-) optical elements 450a, 450b and 450c in FIG. 4, the above explanations concerning FIG. 3 are correspondingly applicable, in which case, of course, the number of three optical elements chosen in the present embodiment is merely by way of example and not restrictive.

Referring to FIGS. 5a-c, the individual mirror elements of the mirror arrangement can also be configured in such a way that the different polarization-optical regions or elements are integrated into these mirror elements.

Figure 5:
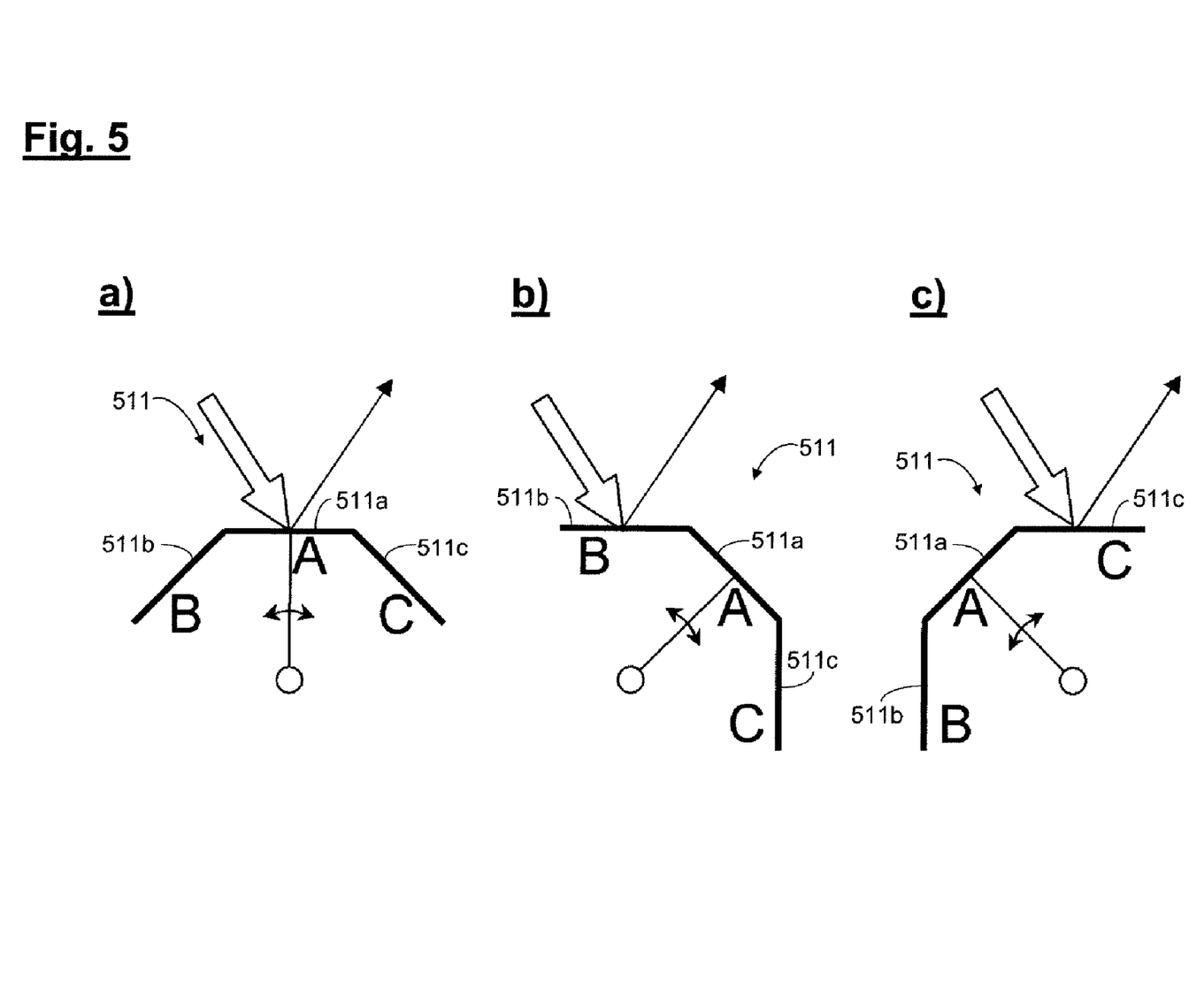
FIGS. 5a-c shows schematic illustrations of an embodiment of a mirror arrangement.

Specifically, in the embodiment shown in FIG. 5, each of the mirror elements, of which only one mirror element 511 is illustrated schematically, has three plane surfaces 511a, 511b and 511c having mutually different polarization-optical effects (illustrated merely schematically by "A", "B" and "C", respectively, in FIG. 5). Analogously to the embodiments described above, these different polarization-optical effects can once again be realized by suitable retarders or optical rotators which can in each case be applied (e.g., adhesively bonded) directly on one of the mirror surfaces 511a, 511b and 511c.

It goes without saying that in the embodiment in FIG. 5, too, the number of different polarization-optical regions or the number of plane surfaces of each of the mirror elements is not limited to three, but can also be larger or smaller.

Analogously to the embodiments described above, an increased flexibility with regard to the setting of different polarization states is achieved by increasing the tilting angle range in the mirror arrangement. In contrast to the embodiments in FIG. 3 and FIG. 4, however, the beam paths themselves remain unchanged in the embodiment in FIG. 5, such that (unlike in the embodiments in FIG. 3 and FIG. 4) in principle no further modifications may be needed in the initial system from FIG. 2.

Figure 6:
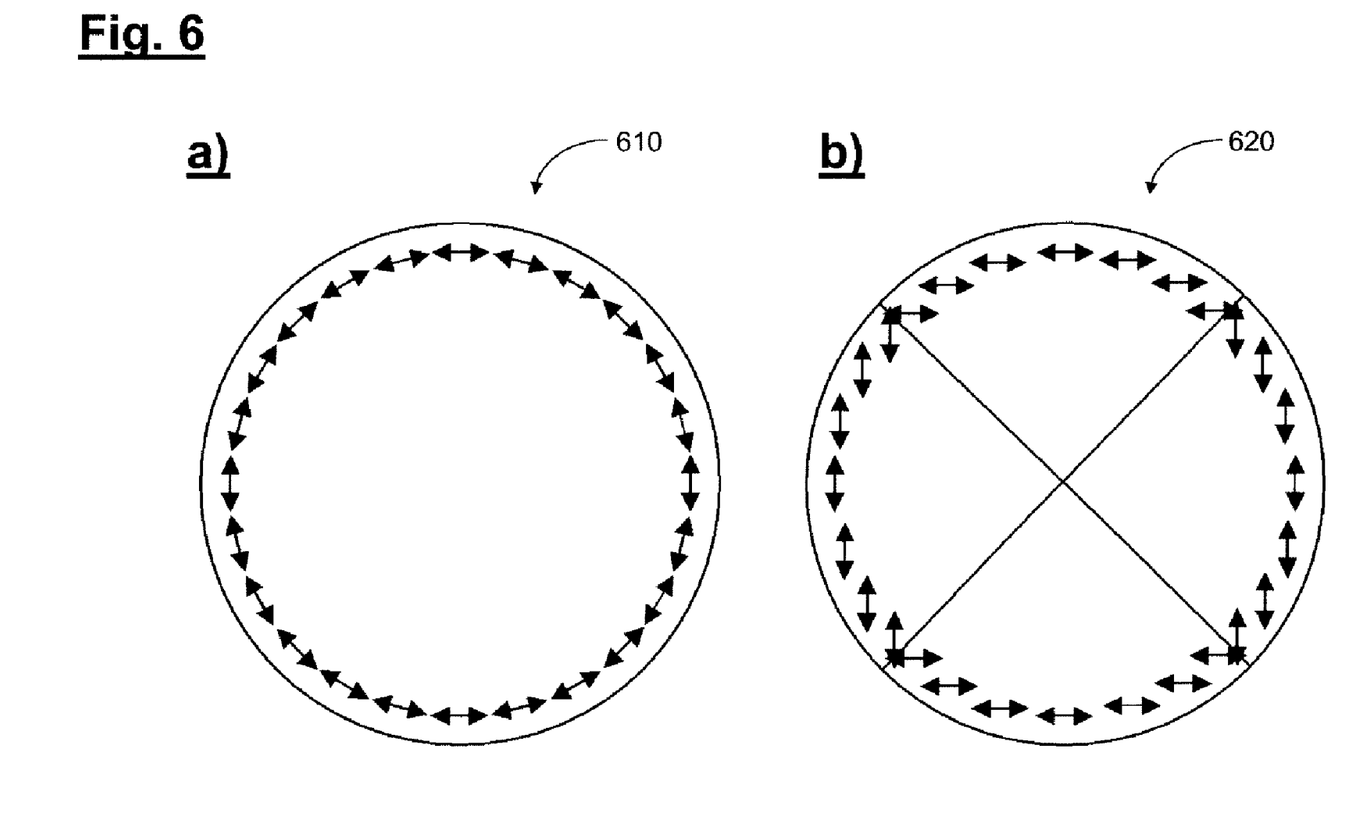
FIGS. 6a-b show examples of illumination settings set in a pupil plane of the illumination device.

FIG. 6a shows an example of illumination settings set in a pupil plane 610 of the illumination device, and FIG. 6B shows another example of illumination settings set in a pupil plane 620 of the illumination device While several embodiments have been described, numerous variations and alternative embodiments are possible, for example through combination and/or exchange of features of individual embodiments. Accordingly, other embodiments are in the claims.

The invention claimed is:

1. An illumination device, comprising:
a deflection device configured to variably deflect first and second light beams impinging on the deflection device independently of one another by variation of the deflection angle in each case so that:
the first light beam can be directed onto a location in a pupil plane of the illumination device along first and second beam paths which are different from each other, wherein the first light beam is influenced differently on the first and second beam paths so that an optical property of the first light beam directed onto a first location in the pupil plane along the first beam path is different from the optical property of the first light beam directed onto the first location in the pupil plane along the second beam path; and
the second light beam can be directed onto a location in the pupil plane of the illumination device along third and fourth beam paths that are different from each other, wherein the second light beam is influenced differently on the third and fourth beam paths so that an optical property of the second light beam directed onto the second location in the pupil plane along the third beam path is different from the optical property of the second light beam directed onto the second location in the pupil plane along the fourth beam path,
wherein:
the optical property comprises a member selected from the group consisting of polarization state, intensity and wavelength; and
the illumination device is configured to be used in a microlithographic projection exposure apparatus.

2. The illumination device of claim 1, wherein each location in the pupil plane can be illuminated by a respective light beam impinging on the deflection device via at least two different beam paths.

3. The illumination device of claim 1, wherein different illumination settings are set in the pupil plane by sole variation of deflection angles produced by the deflection device.

4. The illumination device of claim 1, further comprising a polarization-manipulating optical element arranged in at least one of the first and second beam paths.

5. The illumination device of claim 4, wherein the polarization-manipulating optical element is an optical retarder or an optical rotator.

6. The illumination device of claim 1, wherein the optical property is the polarization state.

7. The illumination device of claim 1, wherein the optical property is the intensity.

8. The illumination device of claim 1, wherein the optical property is the wavelength.

9. The illumination device of claim 1, wherein the deflection device is a mirror arrangement having a plurality of mirror elements which can be adjusted independently of one another in order to alter an angle distribution of the light reflected by the mirror arrangement.

10. The illumination device of claim 9, wherein the mirror elements can be adjusted in an angular range comprising at least the range of −2° to +2°.

11. The illumination device of claim 9, wherein the mirror elements can be adjusted in an angular range comprising at least the range of −5° to +5°.

12. The illumination device of claim 9, wherein the mirror elements can be adjusted in an angular range comprising at least the range of −10° to +10°.

13. The illumination device of claim 1, wherein the deflection device has an exchange device configured to exchange a diffractive optical element.

14. The illumination device of claim 1, further comprising a control device configured to drive the deflection device in a manner dependent on an operating state of the illumination device.

15. The illumination device of claim 1, wherein:
the first light beam can be directed onto a location in the pupil plane of the illumination device along a fifth beam path different from the first and second beam paths, wherein the first light beam is influenced differently on the first, second and fifth beam paths so that the optical property of the first light beam directed onto the first location in the pupil plane along the first beam path is different from the optical property of the first light beam directed onto the first location in the pupil plane along the fifth beam path, and so that the optical property of the first light beam directed onto the first location in the pupil plane along the second beam path is different from the optical property of the first light beam directed onto the first location in the pupil plane along the fifth beam path; and
the second light beam can be directed onto a location in the pupil plane of the illumination device along a sixth beam path different from the third and fourth beam paths, wherein the second light beam is influenced differently on the third, fourth and sixth beam paths so that the optical property of the second light beam directed onto a second location in the pupil plane along the third beam path is different from the optical property of the second light beam directed onto the second location in the pupil plane along the sixth beam path, and so that the optical property of the second light beam directed onto the second location in the pupil plane along the fourth beam path is different from the optical property of the second light beam directed onto the second location in the pupil plane along the sixth beam path.

16. The illumination device of claim 15, wherein on all of the beam paths at least one optical property of the respective light beam is influenced differently relative to the beam paths.

17. A method for the microlithographic production of microstructured components, comprising:
providing a substrate, to which a layer composed of a light-sensitive material is applied at least in part;
providing a mask having structures to be imaged;
providing a microlithographic projection exposure apparatus; and
projecting at least one part of the mask onto a region of the layer with the aid of the projection exposure apparatus,
wherein the microlithographic exposure apparatus comprises:
a projection objective; and
an illumination system according to claim 1.

18. An apparatus, comprising:
an illumination device; and
a projection objective,
wherein the illumination device comprises:
a deflection device configured to variably deflect first and second light beams impinging on the deflection device independently of one another by variation of the deflection angle in each case so that:
the first light beam can be directed onto a location in a pupil plane of the illumination device along first and second beam paths which are different from each other, wherein the first light beam is influenced differently on the first and second beam paths so that an optical property of the first light beam directed onto a first location in the pupil plane along the first beam path is different from the optical property of the first light beam directed onto the first location in the pupil plane along the second beam path; and
the second light beam can be directed onto a location in the pupil plane of the illumination device along third and fourth beam paths that are different from each other, wherein the second light beam is influenced differently on the third and fourth beam paths so that an optical property of the second light beam directed onto a second location in the pupil plane along the third beam path is different from the optical property of the second light beam directed onto the second location in the pupil plane along the fourth beam path,
wherein:
the optical property comprises a member selected from the group consisting of polarization state, intensity and wavelength; and
the apparatus is a microlithographic projection exposure apparatus.

19. The apparatus device of claim 18, wherein each location in the pupil plane can be illuminated by a respective light beam impinging on the deflection device via at least two different beam paths.

20. The apparatus device of claim 18, wherein different illumination settings are set in the pupil plane by sole variation of deflection angles produced by the deflection device.

21. The apparatus device of claim 18, further comprising a polarization-manipulating optical element arranged in at least one of the first and second beam paths.

* * * * *

UNITED STATES PATENT AND TRADEMARK OFFICE
CERTIFICATE OF CORRECTION

PATENT NO. : 8,351,023 B2
APPLICATION NO. : 12/850131
DATED : January 8, 2013
INVENTOR(S) : Markus Deguenther Page 1 of 1

It is certified that error appears in the above-identified patent and that said Letters Patent is hereby corrected as shown below:

Column 2,
Line 42, delete "inceased" and insert --increased--

Column 2,
Line 59, delete "relewant" and insert --relevant--

Column 7,
Line 60, delete "FIG. 6B" and insert --FIG. 6b--

Column 7,
Line 62, delete "device" and insert --device.--

Signed and Sealed this
Twenty-sixth Day of March, 2013

Teresa Stanek Rea
*Acting Director of the United States Patent and Trademark Office*